(12) United States Patent
Siu

(10) Patent No.: US 7,702,296 B2
(45) Date of Patent: Apr. 20, 2010

(54) TRANSMIT/RECEIVE SWITCH

(75) Inventor: Christopher Siu, Vancouver (CA)

(73) Assignee: Mediatek USA Inc., San Jose, CA (US)

( * ) Notice: Subject to any disclaimer, the term of this patent is extended or adjusted under 35 U.S.C. 154(b) by 455 days.

(21) Appl. No.: 11/832,094

(22) Filed: Aug. 1, 2007

(65) Prior Publication Data
US 2009/0036065 A1   Feb. 5, 2009

(51) Int. Cl.
*H04B 1/44*   (2006.01)

(52) U.S. Cl. .............................. 455/78; 455/80; 455/82; 455/83; 455/121; 455/280; 455/281; 333/100; 333/101; 333/103; 333/124

(58) Field of Classification Search .............. 455/552.1, 455/553.1, 550.1, 73, 78–83, 120–121, 124–125, 455/127.1, 280–282, 284–293; 333/100–104, 333/124, 134, 175
See application file for complete search history.

(56) References Cited

U.S. PATENT DOCUMENTS

| 6,108,527 | A  | * | 8/2000  | Urban et al. ............. 455/115.3 |
| 6,735,418 | B1 | * | 5/2004  | MacNally et al. ............. 455/78 |
| 6,788,958 | B2 | * | 9/2004  | Furutani et al. ........... 455/552.1 |
| 6,987,984 | B1 | * | 1/2006  | Kemmochi et al. ....... 455/552.1 |
| 7,092,679 | B2 |   | 8/2006  | Khorram |
| 7,120,399 | B2 |   | 10/2006 | Khorram |
| 7,171,234 | B2 | * | 1/2007  | Kemmochi et al. ....... 455/552.1 |
| 7,269,391 | B2 | * | 9/2007  | Chiu et al. .................... 455/83 |
| 7,283,793 | B1 | * | 10/2007 | McKay ........................ 455/83 |

OTHER PUBLICATIONS

"An Integrated 5.2GHz CMOS T/R Switch with LC-tuned Substrate Bias" Talwalkar, et al., 2003.

* cited by examiner

*Primary Examiner*—Tuan A Tran
(74) *Attorney, Agent, or Firm*—Thomas, Kayden, Horstemeyer & Risley

(57) ABSTRACT

A radio frequency (RF) transmit/receive switch. The transmit/receive switch comprises an impedance matching circuit and a voltage scaling circuit. The impedance matching circuit matches an incoming RF signal to a low noise amplifier and an outgoing RF signal from a power amplifier. The voltage scaling circuit, coupled to the impedance matching circuit, the power amplifier, and the low noise amplifier, attenuates the outgoing RF signal to a scaled signal within a breakdown voltage of a transistor device in the low noise amplifier during transmission of the outgoing RF signal.

20 Claims, 7 Drawing Sheets

TRANSMIT/RECEIVE SWITCH

BACKGROUND OF THE INVENTION

1. Field of the Invention

The invention relates to wireless communication, and in particular to a transmit/receive switch and a radio frequency integrated circuit (RFIC) for use in wireless communication.

2. Description of the Related Art

In half-duplex communication systems, either the transmitter or receiver would be ON at any given time. Such systems generally adopt one single antenna and a transmit/receive switch, wherein the switch performs the selection of transmitting or receiving paths.

Communication systems support wireless and wired communications between specific communication devices. Such communication systems range from national and/or international cellular telephone systems, the Internet, to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

For each wireless communication device to participate in wireless communications, a radio transceiver (i.e., receiver and transmitter) is built-in or coupled to an associated radio transceiver (e.g., a station for in-home and/or in-building wireless communication networks, RF modem, etc.). In many radio frequency (RF) transceivers, the receiver and transmitter operate in a half duplex mode and thus share the antenna. To facilitate the sharing of the antenna, the RF transceiver includes a transmit/receive (T/R) switch, which is off-chip from the transmit and receive sections.

U.S. Pat. No. 7,092,679 discloses a transmit/receive switch comprising an impedance matching circuit that provides minimal impedance to minimize incoming and outgoing signal loss. However, since the impedance matching circuit connects to both the transmitter and receiver, and since the transmitter and the receiver typically employ transistor devices of different thickness and power supply level, the transmit/receive switch presents reliability issues when high voltage swing is coupled to transistor devices with thin oxide, resulting in oxide breakdown and circuit failure.

Thus a need exists for a transmit/receive switch with improved circuit reliability.

BRIEF SUMMARY OF THE INVENTION

A detailed description is given in the following embodiments with reference to the accompanying drawings.

According to the invention, a radio frequency integrated circuit (RFIC) comprises a transmitter module, a receiver module, and a transmit/receive switch. The transmitter module converts an outgoing baseband signal to an outgoing RF signal, is disabled during signal reception, and comprises a power amplifier transmitting the outgoing RF signal. The receiver module converts an incoming RF signal to an incoming baseband signal, is disabled during signal transmission, and comprises a low noise amplifier receiving the incoming RF signal. The transmit/receive switch, coupled to the power amplifier and the low noise amplifier, comprises an impedance matching circuit and a voltage scaling circuit. The impedance matching circuit, coupled to the power amplifier and the low noise amplifier, provides impedance matching for the incoming and outgoing RF signals. The voltage scaling circuit, coupled to the impedance matching circuit, the power amplifier, and the low noise amplifier, attenuates the outgoing RF signal to a scaled signal within a breakdown voltage of a transistor device in the low noise amplifier during transmission of the outgoing RF signal.

According to another embodiment of the invention, a transmit/receive switch comprises an impedance matching circuit and a voltage scaling circuit. The impedance matching circuit provides impedance matching an incoming RF signal to a low noise amplifier and an outgoing RF signal from a power amplifier. The voltage scaling circuit, coupled to the impedance matching circuit, the power amplifier, and the low noise amplifier, attenuates the outgoing RF signal to a scaled signal within a breakdown voltage of a transistor device in the low noise amplifier during transmission of the outgoing RF signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
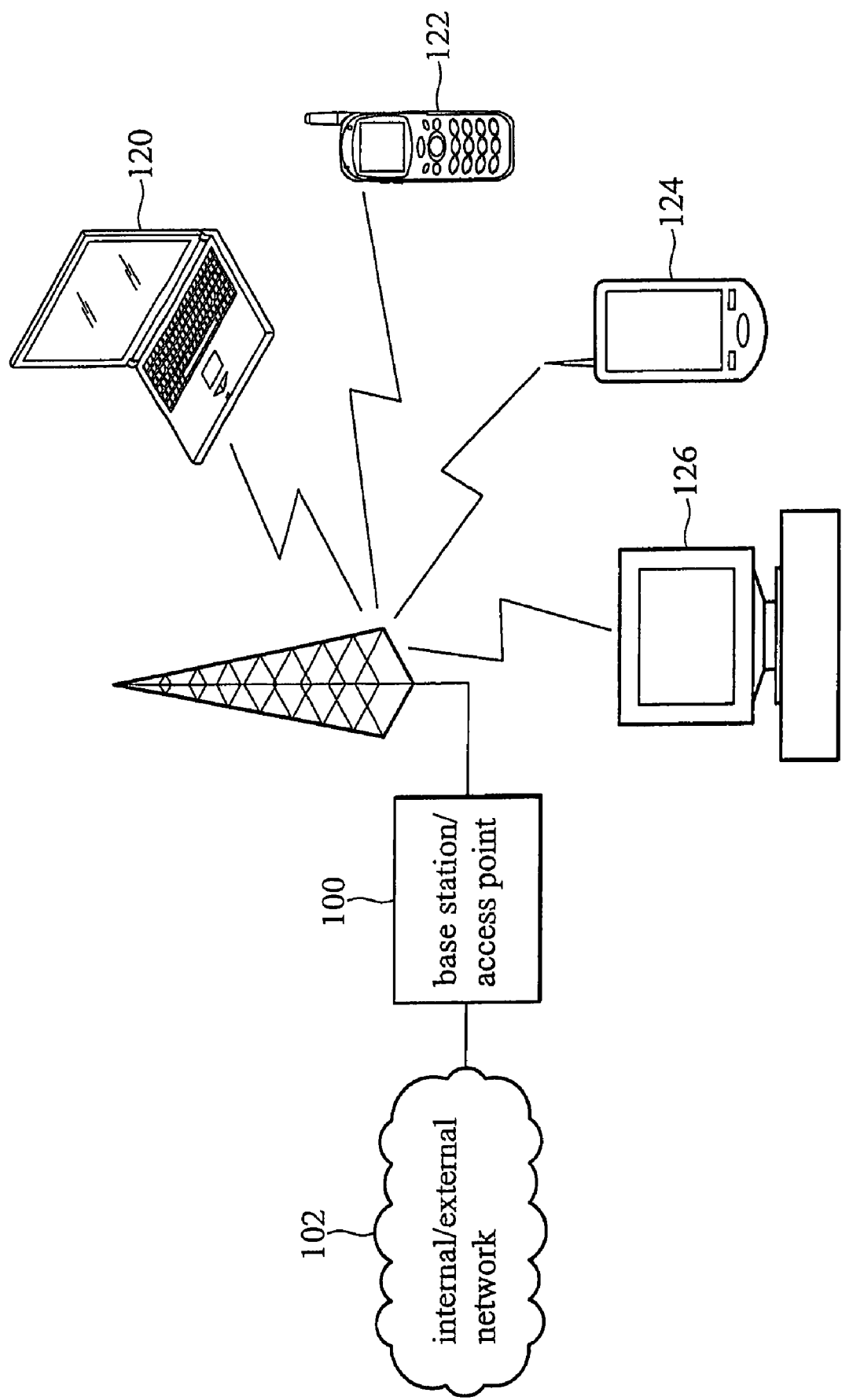
FIG. 1 is a block diagram of an exemplary communication system according to the invention.

FIG. 1 is a block diagram of an exemplary wireless communication system according to the invention, comprising base station (BS)/access point (AP) 100, internal/external network 102, notebook computer 120, cellular phone 122, personal digital assistant (PDA) 124, and personal computer 126. Internal/external network 102 is coupled to Base station/access point 100, and then to notebook computer 120, cellular phone 122, personal digital assistant 124, and personal computer 126.

Base station/access point 100 accesses data via internal/external network 102, which may be an internal network such as local area network, or an external network such as the internet. Base station/access point 100 comprises an antenna to communicate with the wireless communication devices within its coverage, including notebook computer 120, cellular phone 122, PDA 124, and personal computer 126.

Typically, base stations are utilized in mobile telephony systems such as GSM or WCDMA, and access points are utilized in wireless local area networks (WLANs). Each wireless communication device comprises a transmitter and a receiver coupled to a built-in or added-on antenna for communication with base station/access point 100. In a half duplex communication system, either the transmitter or receiver is enabled. And, a transmit-receive switch is incorporated to provide selection of one therefrom. The wireless communication device may be implemented by one or more integrated circuits.

While FIG. 1 shows an indirect communication system, direct point-to-point communication is also applicable to the disclosure, and those skilled in the art can make modification where appropriate.

Figure 2:
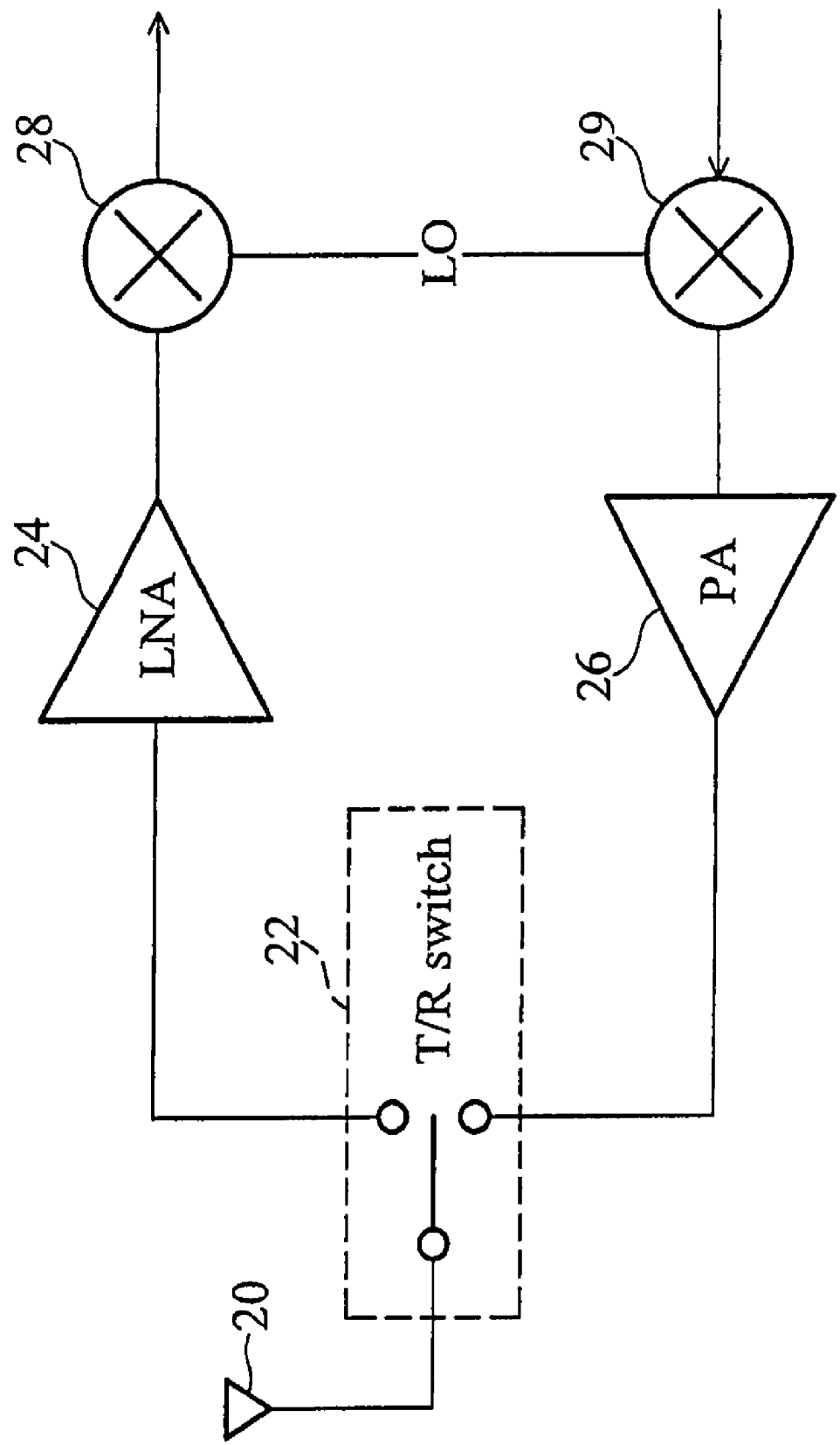
FIG. 2 is a block diagram of an exemplary transceiver in a wireless device of FIG. 1.

FIG. 2 is a block diagram of an exemplary transceiver in a wireless communication device in FIG. 1, comprising antenna 20, Transmit/Receive (T/R) switch 22, low noise amplifier (LNA) 24, power amplifier (PA) 26, down converter 28 and up converter 29. Antenna 20 is coupled to T/R switch 22, low noise amplifier (LNA) 24 and power amplifier (PA) 26, down converter 28 and up converter 29.

T/R switch 22 connects antenna 20 to either a transmit or receive path. In the transmit path, up converter 29 modulates outgoing data from a host device (not shown) with a local oscillation signal from a local oscillator (not shown) to provide an outgoing RF signal, amplified by power amplifier 26 then passed to antenna 22 for transmission to a wireless medium via T/R switch 22. The outgoing data may be a baseband or intermediate frequency signal. In the receive path, antenna 20 picks up an incoming RF signal from a wireless medium to deliver to low noise amplifier 24 via T/R switch 22, amplified therein and demodulated in down converter 28 by the local oscillation signal from the local oscillator (not shown) to generate incoming data for data process. The incoming data may be a baseband or intermediate frequency signal.

Power amplifier 26 employs thick oxide devices and high power supply to produce large signal swing to compensate transmission loss during transmission, while low noise amplifier 24 uses thin oxide devices and low power supply to deliver low noise output. Since the large signal may cause oxide breakdown in thin oxides, consideration is taken to prevent the strong signal swing from power amplifier breaking down the thin oxides.

The transceiver disclosed herein is integrated on a single radio frequency integrated circuit (RFIC) to enhance performance, reduce manufacturing cost, and decrease circuit dimension and complexity.

Figure 3:
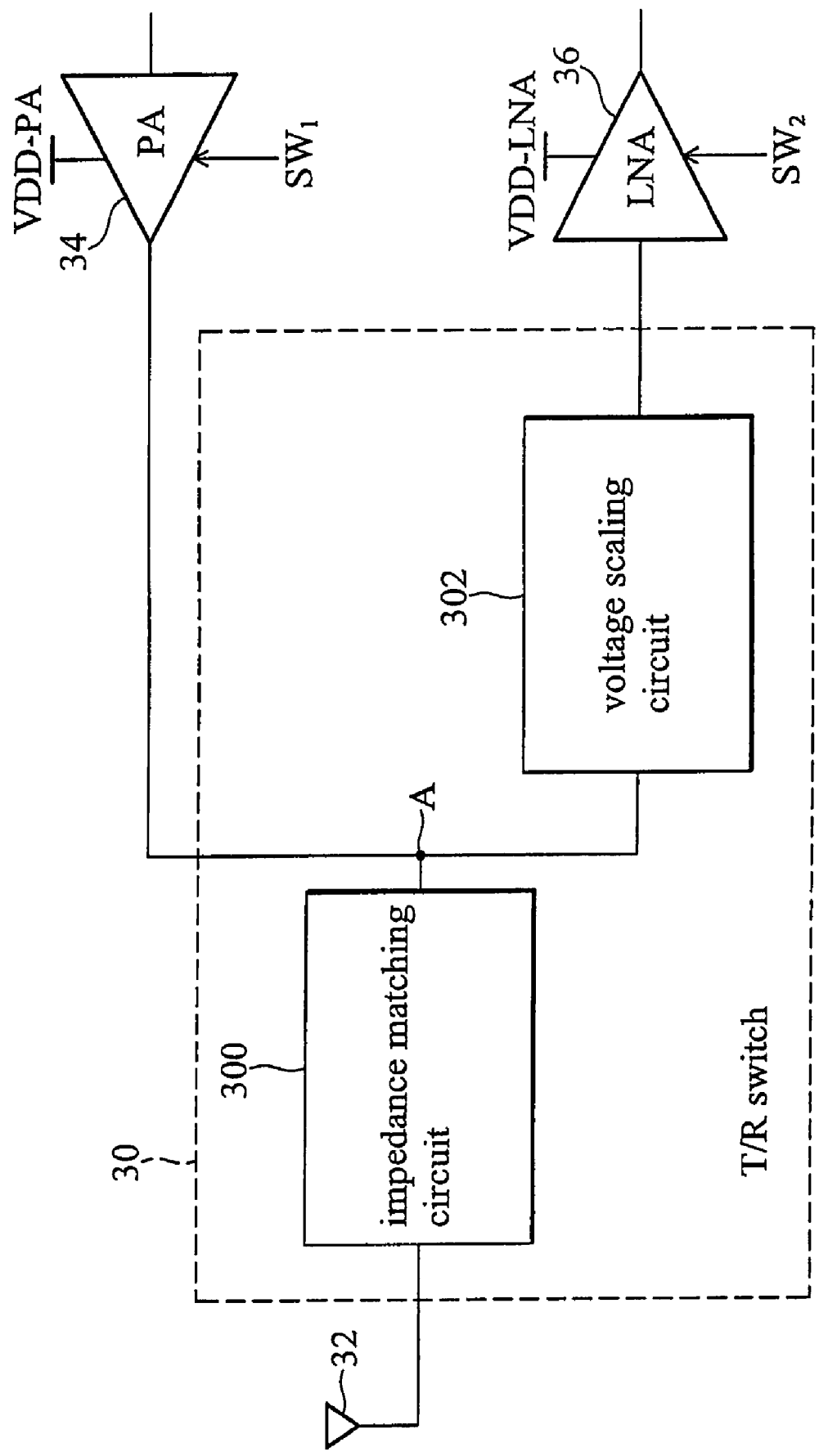
FIG. 3 is a block diagram of an exemplary transmit/receive switch module incorporated in FIG. 2.

FIG. 3 is a block diagram of an exemplary transmit/receive switch module incorporated in FIG. 2, comprising antenna 32, T/R switch 30, power amplifier 34, and low noise amplifier 36. Antenna 32 is coupled to T/R switch 30, and subsequently to power amplifier 34 and low noise amplifier 36. T/R switch 30 comprises impedance matching circuit 300 and voltage scaling circuit 302. Antenna 32 is coupled to matching circuit 300, and then to voltage scaling circuit 302.

Antenna 32 communicates with a remote transceiver, such as a base station, an access point, or a notebook computer, transmits the outgoing RF signal from power amplifier 34 and receives the incoming RF from air to low noise amplifier 36 via S/R switch 30.

Power amplifier 34 amplifies an outgoing signal to generate an outgoing RF signal for transmission via antenna 32. Low power amplifier 36 receives an incoming RF signal and increases its strength for further processing. In operation, first switch $SW_1$ turns power amplifier 34 on during transmission of the outgoing RF signal, and inactivates power amplifier 34 during receipt of the incoming RF signal. Conversely, second switch $SW_2$ turns low noise amplifier 36 on during receipt of the incoming RF signal, and inactivates low noise amplifier 36 during transmission. First and second switches $SW_1$ and $SW_2$ can be implemented by transistors or other means. Power amplifier 34 is implemented by thick oxide devices to deliver higher power, while low noise amplifier 36 utilizes thin oxide devices to achieve high gain and low noise. To accommodate different oxide thickness, power amplifier 34 utilizes a voltage supply exceeding that of low noise amplifier 36, i.e., VDD-PA is higher than VDD-LNA. Since both thick and thin oxide devices are integrated on one RFIC, oxide breakdown may occur to the thin oxides during high voltage swing from thick oxide devices.

T/R switch 30 comprises impedance matching circuit 300 and voltage scaling circuit 302 coupled thereto. Impedance matching circuit is coupled to the power amplifier and the low noise amplifier to provide input and output impedance matching for the incoming and outgoing RF signals, reducing loss due to impedance mismatch over the operating frequency range. The voltage scaling circuit is coupled to power amplifier 34 and low noise amplifier 36, and attenuates the outgoing RF signal to a scaled signal within a breakdown voltage of the thin oxide device during transmission of the outgoing RF signal, thereby preventing the oxide breakdown in low noise amplifier 36. During receipt of the incoming RF signal, voltage scaling circuit 302 is disabled to bypass the incoming RF signal to low noise amplifier 36 directly, providing low impedance path to the input of LNA 36.

Figure 4:
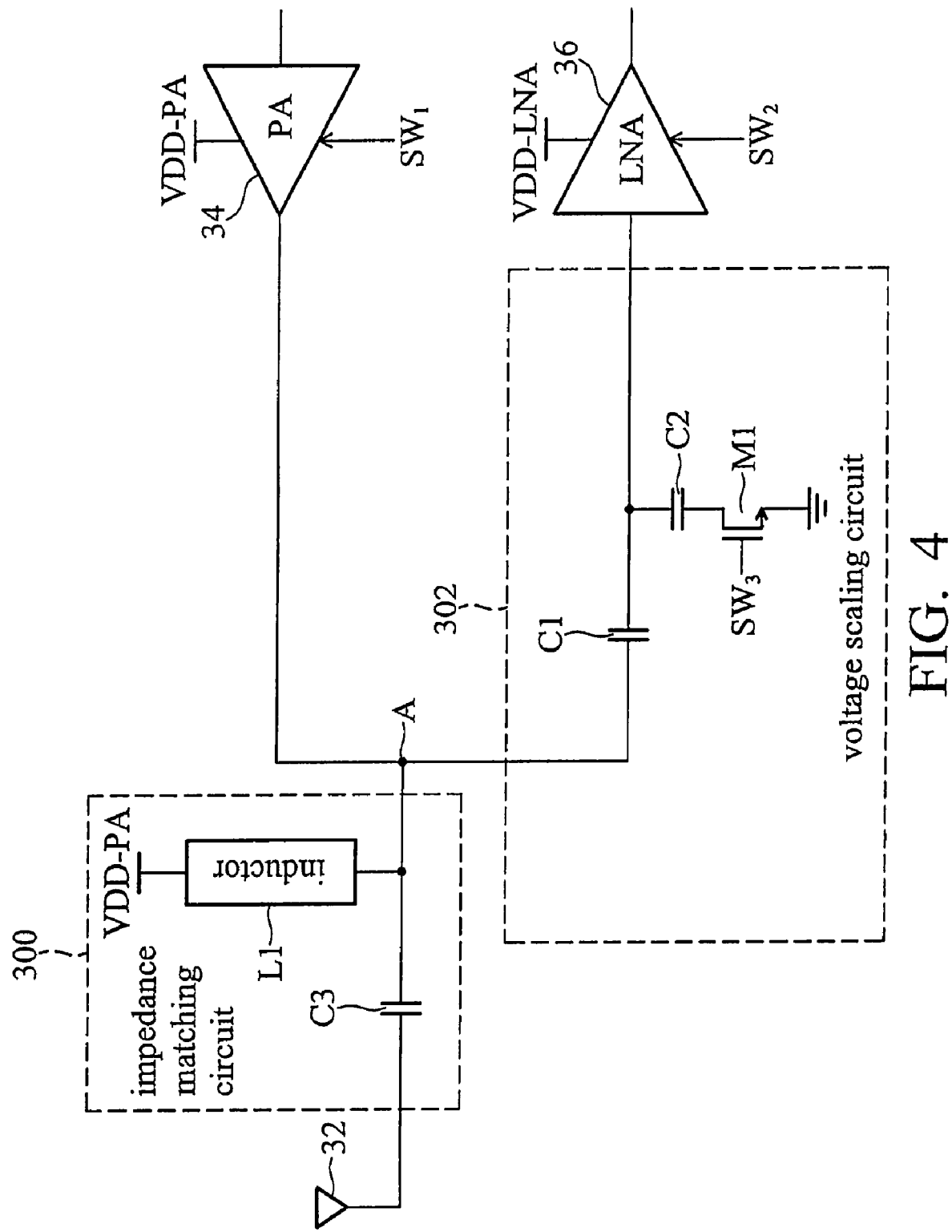
FIG. 4 is a circuit schematic of an exemplary transmit/receive switch module incorporated in FIG. 2.

FIG. 4 is a circuit schematic of an exemplary transmit/receive switch module incorporated in FIG. 2, comprising antenna 32, impedance matching circuit 300, voltage scaling circuit 302, power amplifier 34 and low noise amplifier 36.

The operations of antenna 32, power amplifier 34, and low noise amplifier 36 are the same as disclosed in the transmit/receive switch module in FIG. 3, and thus are not repeated for simplicity.

Impedance matching circuit 300 comprises inductor L1 and capacitor C3. Voltage scaling circuit 302 comprises capacitors C1, C2, and NMOS transistor M1. Capacitors C1 and C2 are connected in series, serving as a voltage divider attenuating an input signal at capacitor C1 into a scaled signal to an input of low noise amplifier 36. The scaling factor of the voltage divider is determined by the ratio of capacitors C1 and C2. NMOS transistor M1 controls activity of the voltage divider, enabled when NMOS transistor M1 is on and disabled when NMOS transistor M1 is off. In operation, NMOS transistor is turned on to the triode region when power amplifier 34 transmits the outgoing RF signal, in turn grounding capacitor C2 and enabling the voltage divider, so that the outgoing RF signal is attenuated to a level less than the breakdown voltage of the thin oxides in low noise amplifier 36. The series combination of capacitors C1 and C2 also filters out the harmonics in the transmitted RF signal. NMOS transistor M1 is turned off when low noise amplifier 36 receives the incoming RF signal, in turn disconnects capacitor C2 from the ground and disabling the voltage divider, so that the incoming RF signal is coupled to low noise amplifier 36 through capacitor C1. Capacitor C1 has a low impedance to reduce transmission loss of the incoming RF signal.

The transmit/receive switch in FIG. 4 utilizes voltage scaling circuit 302 to prevent oxide breakdown, thereby enhancing reliability. In addition, the disclosure also deploys only one inductor, and is fully compatible with CMOS process, thus reducing manufacturing cost and circuit complexity.

Figure 5:
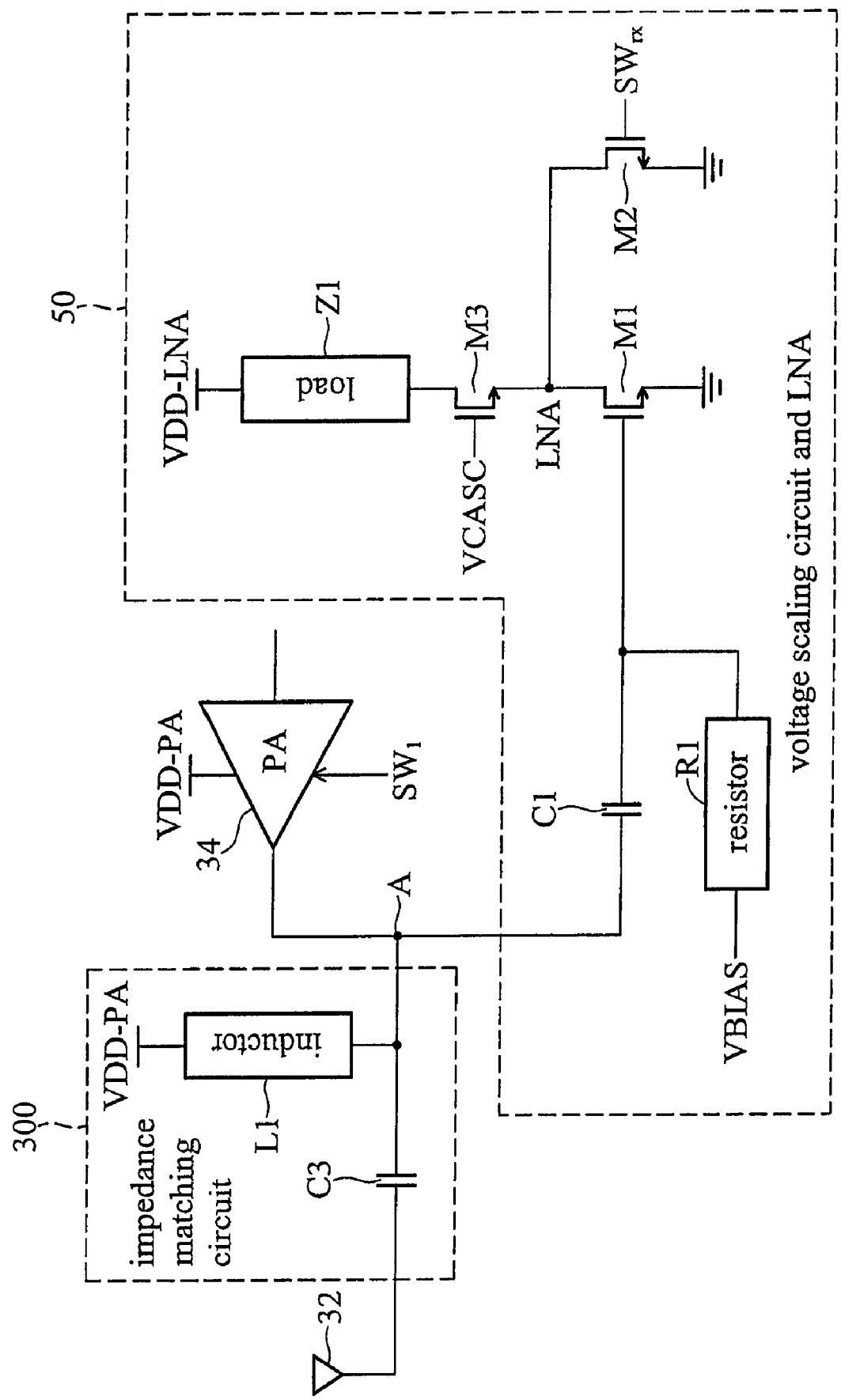
FIG. 5 is a circuit schematic of another exemplary transmit/receive switch module incorporated in FIG. 2.

FIG. 5 is a circuit schematic of another exemplary transmit/receive switch module incorporated in FIG. 2, comprising antenna 32, impedance circuit 300, power amplifier 34, and voltage scaling circuit and low noise amplifier 50.

Detailed illustration of antenna 32, power amplifier 34 and input impedance circuit 300 has been disclosed above in FIGS. 3 and 4. In this embodiment, the transmit/receive switch module as shown in FIG. 5 utilizes a voltage scaling circuit and low noise amplifier 50 which is a self protective LNA, comprising capacitor C1, resistor R1, NMOS transistors M1, M2, and M3, and load Z1. Capacitor C1, resistor R1, NMOS transistors M1, M2 function as a voltage scaling circuit, and transistors M1, M3 and load Z1 function as a low noise amplifier in cascode configuration. NMOS transistor M2 is utilized to activate only one of voltage scaling circuit and low noise amplifier at a time. For example, when NMOS M2 is on, the drain of transistor M1 is shunted to the ground and then transistor M3 is turned off and transistor M1 is turned into a MOS capacitor (MOSCAP), resulting in the low noise amplifier being disabled and the voltage scaling circuit enabled. When NMOS M2 is off, transistors M1 and M3 are biased in saturation, enabling the cascoded low noise amplifier and disabling the voltage scaling circuit. In operation, switch $SW_{rx}$ turns transistor M2 on in the transmission mode, so that the cascoded low noise amplifier is inactivated and the voltage scaling circuit is enabled, thereby protecting the input of the low noise amplifier from the high voltage swing of power amplifier 34. In the reception mode, switch $SW_{rx}$ turns transistor M2 off to activate the cascoded low noise amplifier for receiving the incoming RF signal. The cascoded LNA receives the incoming RF signal through capacitor C1, blocking the high voltage supply VDD-PA.

The transmit/receive switch in FIG. 5 utilizes voltage scaling circuit and LNA 50 to prevent oxide breakdown, single inductor to provide impedance matching, and is CMOS process compatible, thereby enhancing circuit performance, reducing manufacturing cost and circuit complexity.

Figure 6:
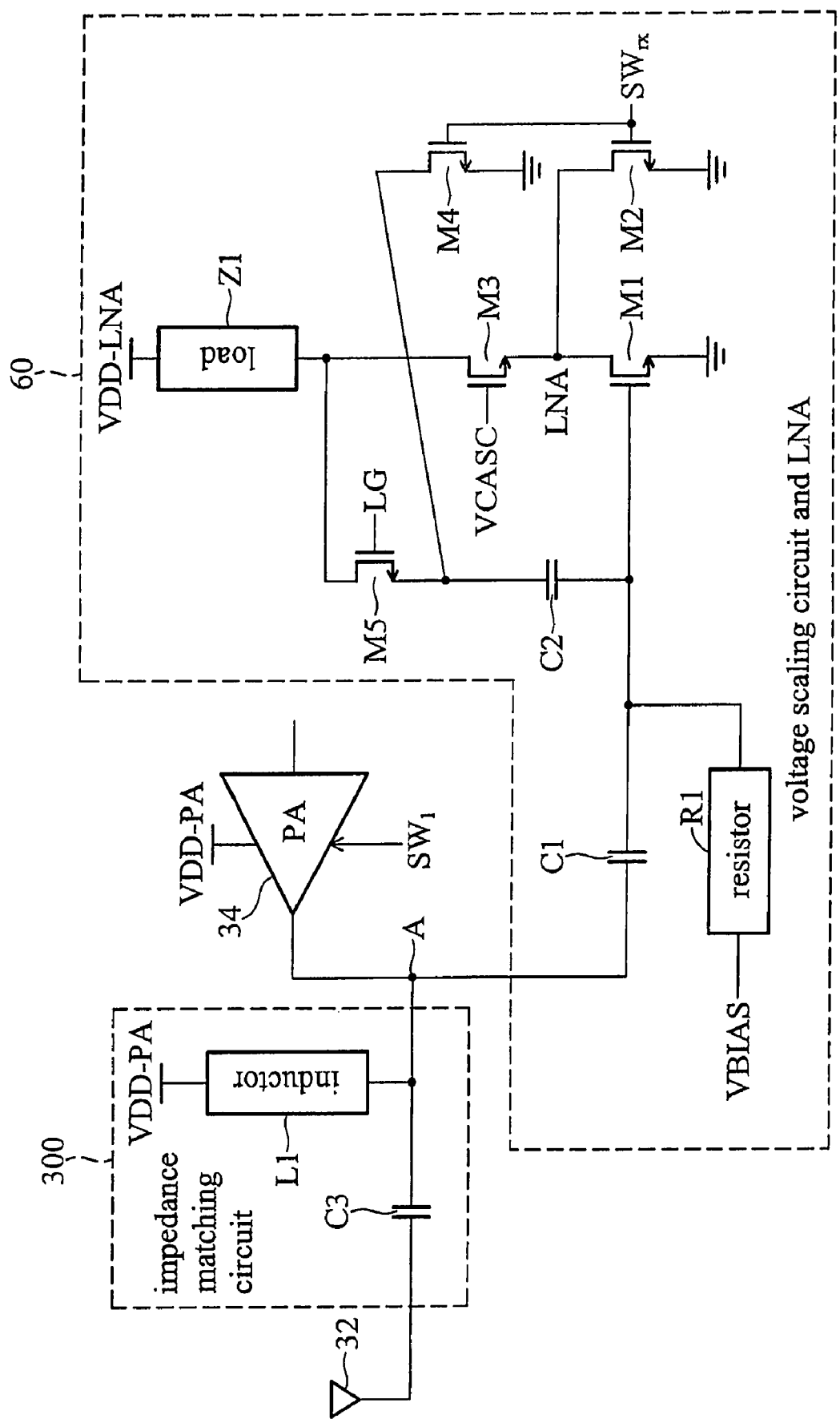
FIG. 6 is a circuit schematic of yet another exemplary transmit/receive switch module incorporated in FIG. 2.

FIG. 6 is a circuit schematic of yet another exemplary transmit/receive switch module incorporated in FIG. 2, comprising antenna 32, impedance matching circuit 300, power amplifier 34, and voltage scaling circuit and low noise amplifier 60.

Again, detailed illustration of antenna 32, power amplifier 34 and input impedance circuit 300 has been disclosed above in FIGS. 3 and 4. In this embodiment, the transmit/receive switch module as shown in FIG. 6 utilizes a unique voltage scaling circuit and LNA 60 to prevent oxide breakdown and to provide an adaptive gain control. The transmit/receive switch module as shown in FIG. 6 offers gain adaptation for the incoming RF signal.

Low noise amplifier 60 comprises a high gain path and a low gain path, the high gain path amplifies the incoming RF signal with a higher gain than that of the low gain path. Low noise amplifier 60 includes NMOS transistors M1 through M5, capacitors C1 and C2, resistor R1 and load Z1. The low noise amplifier in FIG. 6 provides a low gain path on the top of the LNA circuit in FIG. 5. NMOS transistors M5 and capacitor C2 constitute the low gain path. Capacitors C1 and C2 function as a voltage scaling circuit, and transistor M5 functions as a low noise amplifier providing the low gain path. NMOS transistors M4 and M2 are utilized to activate only one of voltage scaling circuit and low noise amplifier at a time. The operation of M2 was described previously. In the transmission mode, switch $SW_{rx}$ turns transistor M4 on to inactivate transistor M5 and shunt capacitor C2 to the ground in parallel to the MOSCAP formed by transistor M1. The combined capacitance of capacitor C2 and MOSCAP M1 is further increased in comparison to FIG. 5, thus the high voltage swing of power amplifier 34 is scaled down to a larger degree, thereby protecting the input of the low noise amplifier from the high voltage swing of power amplifier 34. In the reception mode, switch $SW_{rx}$ turns transistor M4 off to activate the low gain path of the low noise amplifier for receiving the incoming RF signal.

In addition, the transmit/receive switch module of the embodiment utilizes a single inductor to provide impedance matching. The transmit/receive switch module is CMOS process compatible, thereby enhancing circuit performance, reducing manufacturing cost and circuit complexity.

Figure 7:
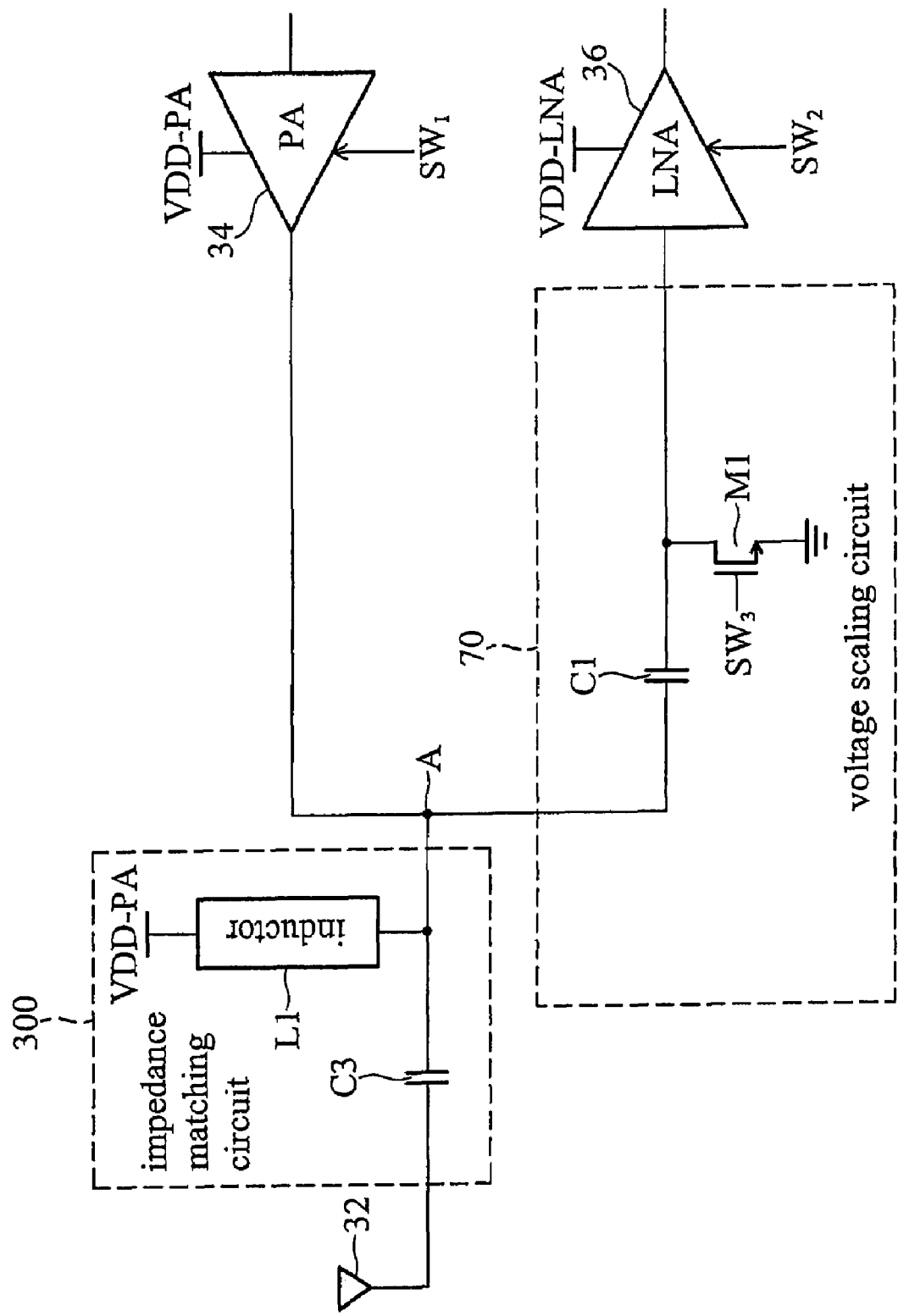
FIG. 7 is a circuit schematic of still another exemplary transmit/receive switch module incorporated in FIG. 2.

FIG. 7 is a circuit schematic of still another exemplary transmit/receive switch module incorporated in FIG. 2, comprising antenna 32, impedance matching circuit 300, voltage scaling circuit 70, power amplifier 34, and low noise amplifier 36.

The detailed illustration of antenna 32, power amplifier 34, low noise amplifier 36 and input impedance circuit 300 has been disclosed above in FIGS. 3 and 4. In this embodiment, voltage scaling circuit 70 comprises a capacitor C1 and a transistor M1. In transmit mode, the transistor M1 is turned on to the triode region to shunt the capacitor C1 to ground. The input of low noise amplifier 36 is also grounded to be protected from the output swing of the power amplifier. Capacitor C1 also provides harmonic filtering to the output signal of power amplifier 34. Since the impedance matching circuit 300 is used for both the power amplifier 34 and the low noise amplifier (LNA) 36 for signal transmission and reception, the size of capacitor C1 may be restricted for better performance.

The transmit/receive switch in FIG. 7 utilizes voltage scaling circuit 70 to prevent oxide breakdown, single inductor to provide impedance matching, and is CMOS process compatible, thereby enhancing circuit performance, reducing manufacturing cost and circuit complexity.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A radio frequency integrated circuit (RFIC), comprising:
    a transmitter module for converting an outgoing baseband signal to an outgoing RF signal, comprising a power amplifier (PA) transmitting the outgoing RF signal;
    a receiver module for converting an incoming RF signal to an incoming baseband signal, comprising a low noise amplifier (LNA) receiving the incoming RF signal; and
    a transmit/receive switch, coupled to the power amplifier (PA) and the low noise amplifier (LNA), comprising:
        an impedance matching circuit, coupled to the power amplifier (PA) and the low noise amplifier (LNA), for impedance matching the incoming and outgoing RF signals; and
        a voltage scaling circuit, coupled to the impedance matching circuit, the power amplifier (PA), and the low noise amplifier (LNA), attenuating the outgoing RF signal into a scaled signal, wherein the voltage of the scaled signal is within a breakdown voltage of a transistor in the low noise amplifier (LNA).

2. The RFIC of claim 1, wherein the voltage scaling circuit is a voltage divider, attenuating the outgoing RF signal to generate the scaled signal.

3. The RFIC of claim 1, wherein the voltage scaling circuit is enabled during signal transmission and is disabled during signal reception.

4. The RFIC of claim 1, wherein the voltage scaling circuit comprises:
first and second capacitors, the first and the second capacitors being connected in series, the first capacitor being coupled to the impedance matching circuit and the power amplifier (PA) and receiving the outgoing RF signal, the second capacitor being coupled to the low noise amplifier (LNA) and producing the scaled signal during transmission of the outgoing RF signal; and
a first transistor, coupled to the second capacitor, grounding the second capacitor during transmission of the outgoing RF signal and disconnecting the second capacitor from ground during receipt of the incoming RF signal.

5. The RFIC of claim 1, wherein the voltage scaling circuit comprises:
a first capacitor, coupled to the impedance matching circuit and the power amplifier (PA);
a bias resistor, providing a bias voltage;
a first transistor, coupled to the first capacitor and the bias transistor, receiving the bias voltage to function as a second capacitor or the low noise amplifier (LNA); and
a second transistor, coupled to the first transistor, controlling the first transistor to enable the second capacitor during transmission of the outgoing RF signal and to disable the second capacitor during receipt of the incoming RF signal.

6. The RFIC of claim 5, wherein the low noise amplifier (LNA) comprises a high gain path and a low gain path, the high gain path amplifies the incoming RF signal with a higher gain than that of the low gain path; and the voltage scaling circuit further comprises:
a third capacitor, coupled to the low gain path, the first capacitor, and the first transistor; and
a third transistor coupled to the third capacitor, grounding the third capacitor during transmission of the outgoing RF signal, and disconnecting the third capacitor from ground during receipt of the incoming RF signal.

7. The RFIC of claim 1, wherein the voltage scaling circuit comprises:
a first capacitor; and
a first transistor, coupled to the capacitor, grounding the first capacitor during transmission of the output RF signal.

8. The RFIC of claim 1, wherein the power amplifier (PA) comprises thick oxide transistors and the low noise amplifier (LNA) comprises thin oxide transistors.

9. The RFIC of claim 1, wherein a power supply of the power amplifier (PA) exceeds than that of the low noise amplifier (LNA).

10. The RFIC of claim 1, wherein the low noise amplifier (LNA) is a cascode amplifier.

11. A transmit/receive switch, coupled to a power amplifier (PA) and a low noise amplifier (LNA) of a radio frequency integrated circuit (RFIC), comprising:
an impedance matching circuit, providing impedance matching an incoming RF signal to a low noise amplifier (LNA) and an outgoing RF signal from a power amplifier (PA); and
a voltage scaling circuit, coupled to the impedance matching circuit, the power amplifier (PA), and the low noise amplifier (LNA), attenuating the outgoing RF signal into a scaled signal, wherein the voltage of the scaled signal is within a breakdown voltage of a transistor in the low noise amplifier (LNA).

12. The transmit/receive switch of claim 11, wherein the voltage scaling circuit is a voltage divider, attenuating the outgoing RF signal to generate the scaled signal.

13. The transmit/receive switch of claim 11, wherein the voltage scaling circuit is enabled during signal transmission, and disabled during signal reception.

14. The transmit/receive switch of claim 11, wherein the voltage scaling circuit comprises:
first and second capacitors, connected in series, the first capacitor coupled to the impedance matching circuit and the power amplifier (PA) and receiving the outgoing RF signal, the second capacitor coupled to the low noise amplifier (LNA) and producing the scaled signal during transmission of the outgoing RF signal; and
a first transistor, coupled to the second capacitor, grounding the second capacitor during transmission of the outgoing RF signal and disconnecting the second capacitor from ground during receipt of the incoming RF signal.

15. The transmit/receive switch of claim 11, wherein the voltage scaling circuit comprises:
a first capacitor, coupled to the impedance matching circuit and the power amplifier (PA);
a bias resistor, providing a bias voltage;
a first transistor, coupled to the first capacitor and the bias transistor, receiving the bias voltage to function as a second capacitor or the low noise amplifier (LNA); and
a second transistor, coupled to the first transistor, controlling the first transistor to enable the second capacitor during transmission of the outgoing RF signal and to disable the second capacitor during receipt of the incoming RF signal.

16. The transmit/receive switch of claim 15, wherein the low noise amplifier (LNA) comprises a high gain path and a low gain path, the high gain path amplifies the incoming RF signal with a higher gain than that of the low gain path; and the voltage scaling circuit further comprises:
a third capacitor, coupled to the low gain path, the first capacitor, and the first transistor; and
a third transistor coupled to the third capacitor, grounding the third capacitor during transmission of the outgoing RF signal, and disconnecting the third capacitor from ground during receipt of the incoming RF signal.

17. The transmit/receive switch of claim 11, wherein the voltage scaling circuit comprises:
a first capacitor; and
a first transistor, coupled to the capacitor, grounding the first capacitor during transmission of the output RF signal.

18. The transmit/receive switch of claim 11, wherein the power amplifier (PA) comprises thick oxide transistors and the low noise amplifier (LNA) comprises thin oxide transistors.

19. The transmit/receive switch of claim 11, wherein a power supply of the power amplifier (PA) exceeds that of the low noise amplifier (LNA).

20. The transmit/receive switch of claim 11, wherein the low noise amplifier (LNA) is a cascode amplifier.

* * * * *